United States Patent [19]

Kubota et al.

[11] Patent Number: 4,997,786

[45] Date of Patent: Mar. 5, 1991

[54] METHOD OF FABRICATING A SEMICONDUCTOR DEVICE HAVING BURIED INSULATION LAYER SEPARATED BY DITCHES

[75] Inventors: Masafumi Kubota, Osaka; Bunji Mizuno, Ikoma, both of Japan

[73] Assignee: Matsushita Electric Industrial Co., Ltd., Osaka, Japan

[21] Appl. No.: 355,815

[22] Filed: May 15, 1989

Related U.S. Application Data

[62] Division of Ser. No. 61,262, May 26, 1987, abandoned.

[30] Foreign Application Priority Data

Jun. 13, 1986 [JP] Japan ................................ 61-138527

[51] Int. Cl.$^5$ ............................................ H01L 21/76
[52] U.S. Cl. .................................... 437/62; 437/24; 437/67
[58] Field of Search .................. 357/54, 55, 56, 42, 357/71, 80; 437/26, 24, 38, 62, 65, 66, 67

[56] References Cited

U.S. PATENT DOCUMENTS

| 4,490,182 | 12/1984 | Scovell | 437/26 |
| 4,621,276 | 11/1986 | Malhi | 357/42 |
| 4,725,874 | 2/1988 | Ooga et al. | 357/55 |
| 4,800,170 | 1/1989 | Jain et al. | 437/24 |
| 4,834,809 | 5/1989 | Kakihara | 148/33 |

FOREIGN PATENT DOCUMENTS

| 52-30185 | 3/1977 | Japan | 437/38 |
| 53-31964 | 3/1978 | Japan | 437/61 |
| 53-31971 | 3/1978 | Japan | 437/61 |
| 57-63841 | 4/1982 | Japan | 437/62 |
| 59-188938 | 10/1984 | Japan | 437/67 |
| 59-231833 | 12/1984 | Japan | 437/62 |
| 60-84831 | 5/1985 | Japan | 437/65 |

*Primary Examiner*—Olik Chaudhuri
*Assistant Examiner*—Ourmazd S. Ojan
*Attorney, Agent, or Firm*—Wenderoth, Lind & Ponack

[57] ABSTRACT

A method of fabricating a semiconductor device having a buried insulator region is constituted by forming ditches in a surface of the buried insulator region to be formed which is closest to the surface of the substrate, implanting ions of gas taken from the group consisting of oxygen and nitrogen into the substrate from the surface to form an ion implanted region corresponding to the desired buried insulator region, and heat treating the thus ion implanted substrate at a gas reaction temperature of at least 1100° C. for forming the buried insulator region.

2 Claims, 5 Drawing Sheets

METHOD OF FABRICATING A SEMICONDUCTOR DEVICE HAVING BURIED INSULATION LAYER SEPARATED BY DITCHES

This application is a division of now abandoned application Ser. No. 07/061,262 filed on May 26, 1987, now abandoned.

BACKGROUND OF THE INVENTION

This invention relates to a method of fabricating a semiconductor device having a buried insulation layer separated by ditches and a method of fabricating the same, and more particularly to a semiconductor device having a so-called SOI (silicon-on-insulator) structure with the semiconductor device disposed on a substrate on which a buried insulator region is formed by ion implantation and a method of fabricating the same.

Integrated circuits are being developed very rapidly with respect to higher density, higher speed, and larger capacity. In particular, an integrated circuit based on a complementary MOS circuit (CMOS) possessing both high speed and low power consumption is expected to play a central role in the field of almost all integrated circuits in a few years.

What is particularly promising among such CMOS technologies is the SOI-CMOS technology using the SOI structure. This is because, by applying the SOI structure into the CMOS technology, the latchup phenomenon can be eliminated, higher density is realized, the parasitic capacitance can be reduced, and higher speed and lower power consumption can be realized.

Much has been reported about the forming method of SOI structure. Above all, a method of forming an oxide film layer or a nitride film layer by implanting ions of oxygen or nitrogen into a silicon substrate is regarded as being closest to practical use.

The conventional process of forming a buried nitride film layer by nitrogen ion implantation is disclosed, for example, by G. Zimmer et al. in IEEE Transactions on Electron Devices, vol. ED-30, No. 11, p. 1515 (1983). In this example, first a silicon substrate is thermally oxidized, and a silicon oxide film of about 500 Å is formed thereon. This is to prevent spattering and surface contamination on the silicon substrate surface which may occur at the time of nitrogen ion implantation. In succession, nitrogen ions are implanted at an acceleration energy of 150 KeV, and dose of about $2 \times 10^{18}/cm^2$. At this time, nitrogen ions spread with a Gaussion like distribution with a projection range Rp of about 3500 Å and deviation of about 900 Å. Then, after removing the silicon oxide film, an oxide film of about several thousand angstroms is deposited on the silicon substrate by the CVD method as a cap, and is heated for several hours in an inert gas atmosphere (for example, nitrogen, argon) at 1100° C. to 1200° C. By this heat treatment, the implanted nitrogen atoms react with the neighboring silicon atoms, and a buried nitride film region is formed. Excessive nitrogen atoms diffuse toward the surface or back of the substrate, and react with silicon to form part of the nitride film region. Thus, a nitride film region of about 2500 Å is formed, and a silicon region insulated and separated from the silicon substrate is obtained.

When a CMOS circuit is formed in the above composed SOI structure, it is known to be free from latchup and low in parasitic capacitance, but, to the contrary, the leakage current at the junction is greater as compared with the bulk device, and the transconductance $g_m$ ($g_m = \Delta I_{DS}/\Delta V_{GS}$) is small, and fluctuations of device characteristics are large. As one of their causes, shortness of carrier life time due to crystalline defects and distortions existing in the insulated and isolated silicon region is considered. When a buried insulation film is formed by implanted oxygen or nitrogen ions into the silicon substrate, a volumetric expansion of as much as half of the insulation film occurs, and the stresses in the silicon caused due to this volumetric expansion are not always isotropic, which is considered to cause such distortions and crystalline defects.

SUMMARY OF THE INVENTION

It is hence a primary object of this invention to present a method of fabricating a semiconductor device which eliminates unallowable large leakage currents, drop of transconductance, fluctuations of device characteristics and other unfavorable phenomena which are seen in the conventional integrated circuit device formed in buried insulation film structure.

It is another object of this invention to present a method of preventing occurrence of crystalline defects in a silicon crystal layer in the surface in the semiconductor device manufacturing process which is the cause of failure of such a device.

Furthermore, this invention is intended to solve problems such as a decline of carrier life time by separating the surface silicon region with ditches reaching the buried insulation film and reducing the stress induced from volumetric expansion due to a high dose of implanted ions.

In the method of fabricating a semiconductor device of this invention, after forming ditches in the silicon substrate, a buried insulator region is formed by implanting oxygen or nitrogen ions. Alternatively, ion implantation may be conducted ahead of ditch forming, but in this case, a sufficiently high temperature heat treatment is needed after ditch forming in order to attain the objects of this invention. The depth of the ditches should be enough to reach the buried insulator region or more so as to eliminate the distortions due to volumetric expansion by insulator formation. More preferably, it should be deep enough to approximately reach the buried insulator region bottom. If the ditches are too deep, it is difficult to planarize the surface in later process. As required, moreover, after forming the buried insulator region, silicon on the surface of the monocrystalline silicon region may be developed by epitaxial growth, so that an SOI structure of excellent quality may be obtained.

While the novel features of the invention are set forth in the appended claims, the invention, both as to organization and content, will be better understood and appreciated, along with other objects and features thereof, from the following detailed description taken in conjunction with the drawings.

DETAILED DESCRIPTION OF THE PREFERRED EMBODIMENTS

Figure 1:
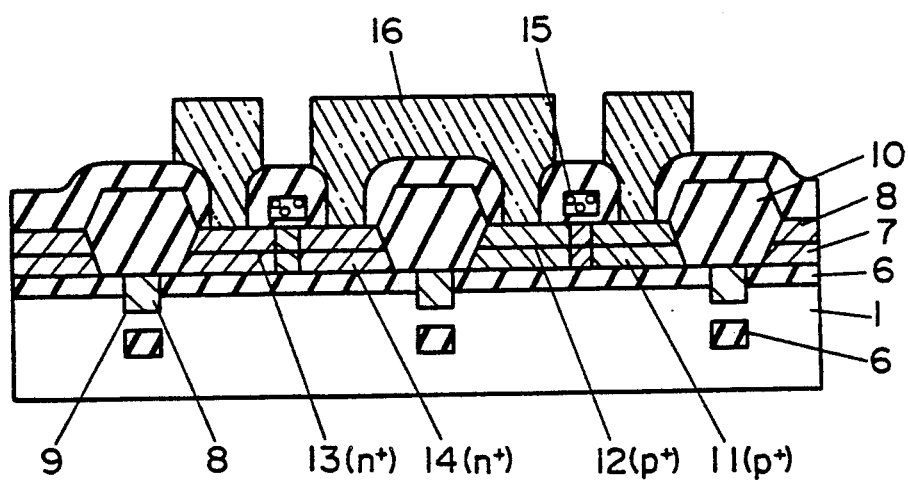
FIG. 1 is a sectional view of a semiconductor device in one of the embodiments of this invention.

FIG. 1, relating to an embodiment of a semiconductor device of this invention, is a cross sectional view of a CMOS (complementary MOS) inverter. In an SOI (silicon-on-insulator) structure composed of a buried oxide film 6 formed in a silicon substrate 1, a surface Si layer 7 separated from the silicon substrate 1 by the buried oxide film, a Si layer 8 formed thereon by epitaxial growth, and a ditch 9 and a thermal oxidation film 10 separating the epitaxial layer 8 from a portion 8A thereof filling the ditches 9, source 11, and drain 12 of a PMOS transistor, and source 13, drain 14, a gate electrode 15, and Al wiring 16 of a NMOS transistor are formed. The separated Si layer 8 is subjected to less stress by the ditch 9 and the thermal oxidation film 10 formed thereon, so that the MOS transistor formed thereon possesses a transconductance of the same level as in a bulk device, and operates at high speed.

Figure 2A:
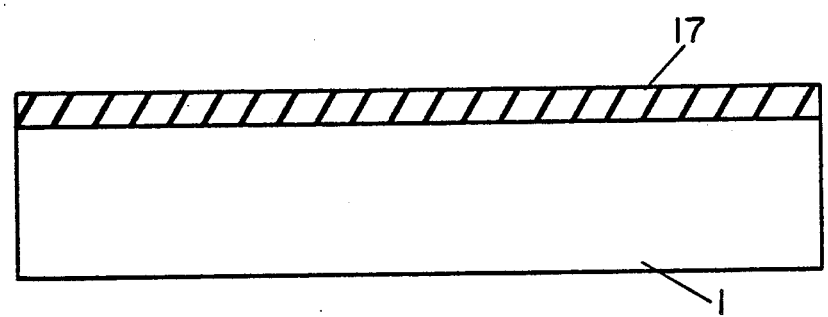
FIGS. 2A–E and 3A–D are sectional views showing a method of fabricating the same semiconductor device.
Figure 2B:
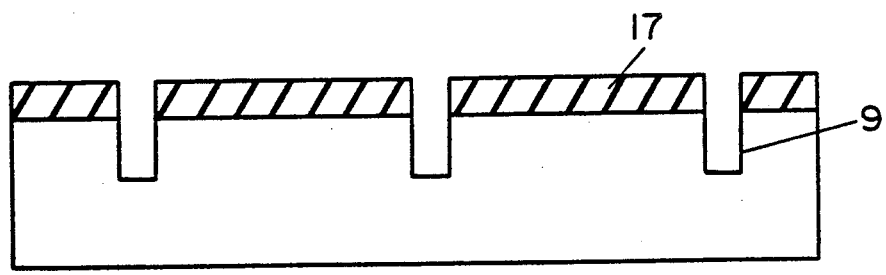
Figure 2C:
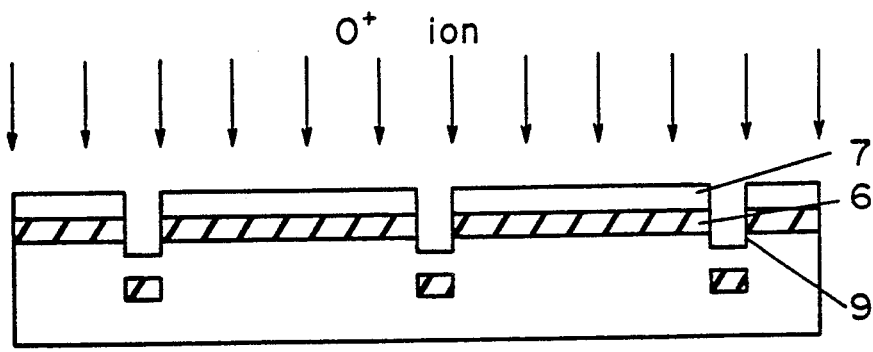
Figure 2D:
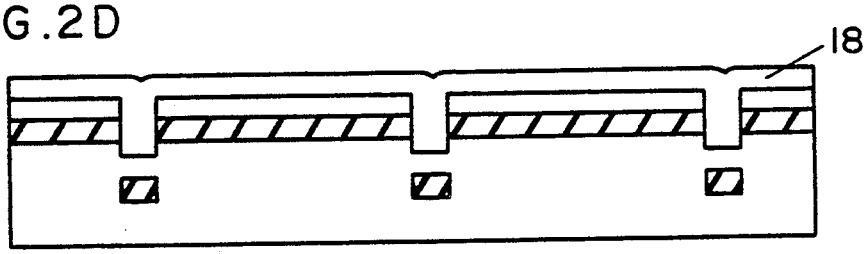
Figure 2E:
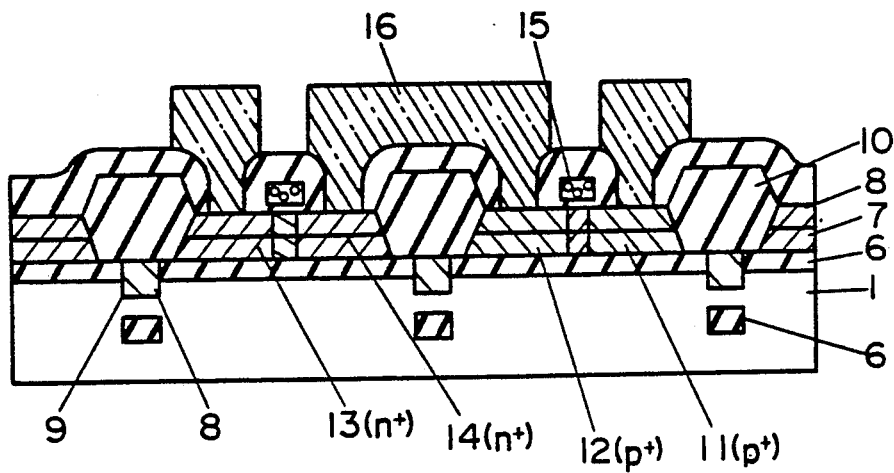

Referring now to the process sectional drawing in FIG. 2, the method of fabricating the semiconductor device of this embodiment is described below. As shown in FIG. 2A, in the first place, an oxide film 17 is deposited to a thickness of about 1 μm on a silicon substrate 1 by the CVD method. In succession, as shown in FIG. 2B, a photoresist mask pattern (not shown) is formed by photolithography, and, using it as the mask, the oxide film 17 is etched, and the photoresist is removed. Using the patterned oxide film 17 as the mask, the silicon substrate 1 is etched to a depth of about 0.3 to 1.0 um, and ditches 9 are formed, each of the ditches being between a pair of spaced-apart walls extending from an upper surface of the substrate. For the etching of the CVD oxide film 17 and silicon substrate 1, reactive ion etching was employed. More specifically, for the etching of the CVD oxide film 17, a gas mixture of CHF and C F was sued as the etching gas, and for the silicon substrate 1, a gas mixture of CC1 and C1 was used, but any other known gases may be used for the same purpose. Then, after removing the CVD oxide film 17 with HF aqueous solution, oxygen ions are implanted (FIG. 2C). This oxygen ion implantation was conducted with an acceleration voltage of 200 kv and dose of 1.5 to 2.5×10 /cm. After oxygen ion implantation, heat treatment was performed for several hours at about 1200 C in a N atmosphere, and a plurality of spaced-apart oxide films 6 and 6A were formed in a thickness of 0.2 to 0.4 um, at a depth of about 0.2 um from the surface of the substrate 1, the oxide films 6A being below the bottom surfaces of the ditches 9 and the oxide films 6 being below areas of the substrate which do not contain ditches 9 therein. Thus, the surface silicon regions 7 (which are part of the original silicon substrate 1) are isolated from the remaining silicon substrate 1 by the oxide films 6 and are exposed to less stress at the time of forming the oxide films 6 and 6A because of the existence of the ditches 9, and an excellent crystalline property is obtained. Subsequently, as shown in FIG. 2D, a silicon epitaxial layer 18 was deposited to a depth of about 0.2 um by the CVD method. Since the surface silicon regions 7 are better in quality than in the conventional product, the quality of the epitaxial layer 18 is also better. By applying a known CMOS process of the epitaxial layer 18 and surface silicon regions 7, a CMOS device as shown in FIG 2E is completed wherein a plurality of the surface silicon regions 7 each have an active device therein and the ditches 9 contain a filling 8A of the epitaxial silicon 18.

A second embodiment of the fabricating method of this invention is described below while referring to the process sectional drawings in FIG. 3A to FIG. 3D.

Figure 3A:
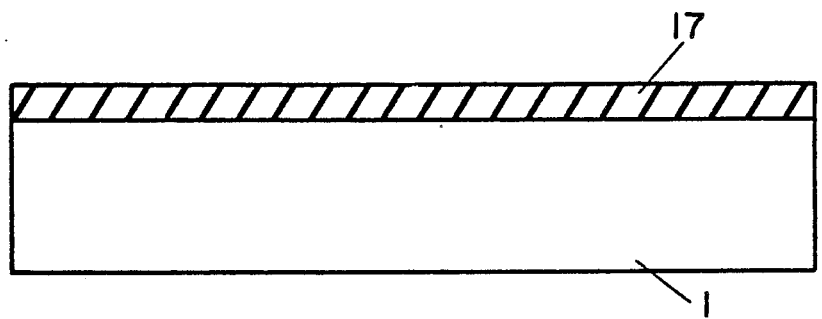
Figure 3B:
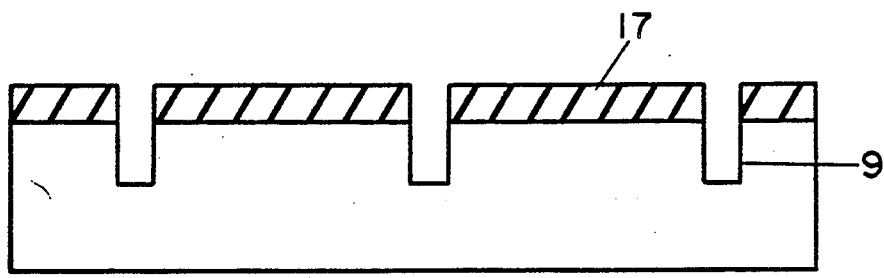
Figure 3C:
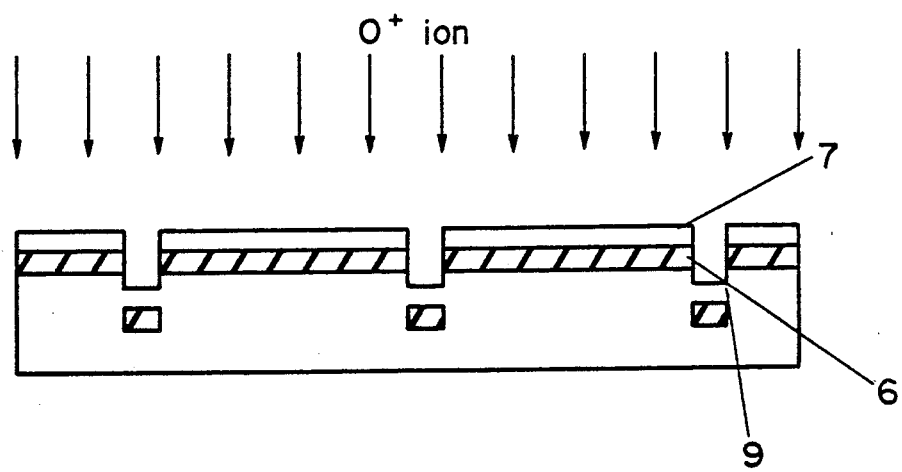
Figure 3D:
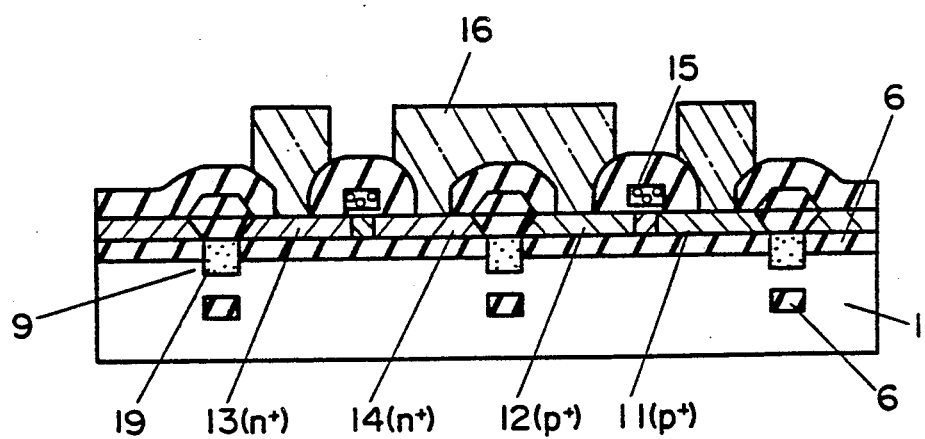

From FIG. 3A to 3C, the process is the same as in the first embodiment. After oxygen ion implantation, heat treatment and formation of the buried oxide films 6 and 6A, a polycrystalline silicon is deposited to a depth of 0.5 to 1 μm, and the surface is flattened by a uniform speed reactive ion etching by photoresist and polycrystalline silicon. As a result, the ditches 9 are filled up with a filling of polycrystalline silicon 19, and a flat surface is obtained. By applying a known CMOS process thereafter, a CMOS device as shown in FIG. 3D was obtained.

The thus fabricated MOS transistor was evaluated, and it was found the merits of the SOI structure, such as small junction capacitance and ease of increasing the density, can be obtained without inferiority in the mobility or transconductance in comparison with the bulk device. Besides, since the area occupied by the ditches can be reduced by disposing the ditches in the separation region between the devices, it is also possible to dispose such ditches around the individual devices.

In this way, when a buried insulator region is formed by forming ditches in the silicon substrate and implanting oxygen or nitrogen ions, the distortions due to volumetric expansion caused by formation of insulator region are lessened by the ditches, and an SOI structure of excellent crystalline property may be obtained. For reduction of distortions, it is preferable to dispose the ditches as closely as possible, but when the number of ditches increases, the region usable as the active region is narrowed. It is therefore preferable to optimize the ditch arrangement depending on the buried insulation film forming condition.

In these embodiments, however, although the buried oxide film was formed by oxygen ion implantation, it is also possible to practice this invention by forming a buried nitride film by nitrogen ion implantation.

Therefore, according to this invention, a semiconductor device of high performance SOI structure integrated at high density will be obtained.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What we claim is:

1. A method of fabricating a semiconductor device having a silicon substrate and a buried insulator region beneath a surface of said substrate, comprising:

forming trenches in said surface of said silicon substrate to a depth at least as great as the distance from said surface of said substrate to a surface of the buried insulator region to be formed which insulator surface is closest to said surface of said substrate;

implanting ions of gas taken from the group consisting of oxygen and nitrogen into said substrate from said surface of said substrate and over the area of the surface of said substrate and said trenches to form an ion implanted region corresponding to the desired buried insulator region; and heat treating the thus ion implanted substrate at a gas-reaction temperature of at least 1100° C. for forming the buried insulator region.

2. A method as claimed in claim 1, further comprising forming a silicon layer on said surface of said substrate and in said trenches while leaving said buried insulator region spaced from said surface of said substrate and from the bottom of said trench by carrying out epitaxial growth at said surface of said substrate for forming said silicon layer.

* * * * *